(12) United States Patent
Murakoshi

(10) Patent No.: US 6,567,954 B1
(45) Date of Patent: *May 20, 2003

(54) PLACEMENT AND ROUTING METHOD IN TWO DIMENSIONS IN ONE PLANE FOR SEMICONDUCTOR INTEGRATED CIRCUIT

(75) Inventor: Masahiro Murakoshi, Tokyo (JP)

(73) Assignees: NEC Corporation, Tokyo (JP); NEC Electronics Corporation, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 501 days.

(21) Appl. No.: 08/989,786

(22) Filed: Dec. 12, 1997

(30) Foreign Application Priority Data

Dec. 12, 1996 (JP) .............................. 8-331968

(51) Int. Cl.7 .............................. G06F 17/50
(52) U.S. Cl. .................. 716/2; 716/8; 716/12
(58) Field of Search .............. 395/500.03, 500.09, 395/500.1, 500.11, 500.12, 500.13, 500.14, 500.15; 716/2, 8, 9, 10, 11, 12, 13, 14

(56) References Cited

U.S. PATENT DOCUMENTS

| | | | | |
|---|---|---|---|---|
| 5,416,722 A | * | 5/1995 | Edwards | 364/491 |
| 5,515,293 A | * | 5/1996 | Edwards | 364/489 |
| 5,644,500 A | * | 7/1997 | Miura et al. | 364/490 |
| 5,689,433 A | * | 11/1997 | Edwards | 364/490 |
| 5,856,927 A | * | 1/1999 | Greidinger et al. | 364/491 |
| 5,984,510 A | * | 11/1999 | Guruswamy et al. | 716/2 |

FOREIGN PATENT DOCUMENTS

| | | |
|---|---|---|
| JP | 63-224237 | 9/1988 |
| JP | 1-241145 | 9/1989 |
| JP | 2-62676 | 3/1990 |
| JP | 4-31970 | 2/1992 |

* cited by examiner

Primary Examiner—Vuthe Siek
(74) Attorney, Agent, or Firm—Katten Muchin Zavis Rosenman

(57) ABSTRACT

A placement and routing method for the semiconductor integrated circuit includes an object describing step for preparing an object description which describes a transistor and a wiring conductor as a transistor object and a wiring object, respectively, and which includes an adjacent information indicative of a relative position information of each object in relation to an adjacent object and a connection information indicative of a connection destination of each object, a transistor object processing, step for generating each transistor in accordance with the object description and locating the generated transistor by considering the adjacent information, a wiring object processing step for determining a position of each wiring in a horizontal direction and in a vertical direction, an object end point determining step for determining a final position of each transistor object and a final staring point and a final terminating point of each wiring object, and a wiring post-processing step for wiring each wiring object by a designated wiring layer.

9 Claims, 9 Drawing Sheets

PLACEMENT AND ROUTING METHOD IN TWO DIMENSIONS IN ONE PLANE FOR SEMICONDUCTOR INTEGRATED CIRCUIT

BACKGROUND OF THE INVENTION

1. Field of the Invention

The present invention relates to a placement and routing method for a semiconductor device, and more specifically to a placement and routing method for a semiconductor integrated circuit, using a computer aided design (abbreviated to a "CAD").

2. Description of Related Art

At the time of performing a layout design by use of the CAD, the design is performed for each of different kinds of basic cells including an inverter, NAND, NOR, etc. In this case, it is general that in the same basic cell, a plurality of transistors constituting the basic cell are different in transistor size from one another, because of a circuit characteristics of an individual basic cell. In the prior art, therefore, a design method has been adopted in which a required number of kinds of basic cells, namely, parameterized cells are previously prepared in order to automatically generate necessary basic cells when a design rule, a transistor size and others are inputted.

The prior art placement and routing method for realizing the above mentioned parameterized cells includes the following two approaches: Namely, a first placement and routing method is that only transistors are expressed as an object, and wiring conductors and contacts are described by a relational equation; and a second placement and routing method is that transistors are described as an object, and only a relative position between transistor objects are designated, and a wiring between the objects is automatically performed in accordance with connection information.

Firstly, a concept of the transistor object will be explained with reference to FIG. 1 which diagrammatically illustrates the transistor object. The transistor object is expressed by expressing a transistor graphic form as one set regardless of the transistor size, and includes imaginary terminal positions TG, TS and TD of a gate, a source and a drain, transistors sizes L (length) and W (width), and a location origin position OXY.

Now, the first prior art placement and routing method will be explained with reference to a flow chart of FIG. 2. First, in a step P1, parameters of the transistor size are set as the transistor object, and then, a relational equation between the transistor object and wiring conductors and contacts is described. This relational equation is prepared to the effect that a location position or a wiring position is determined on the basis of already located graphic forms and the design rule. Furthermore, the wiring description includes information concerning a designated wiring conductor layer, and the contact description includes a name of a contact cell to be located.

In a step P2, the origin of a first transistor object is determined, and in accordance with the relational equation, generation and location of transistors in a step P4, or a location of wiring conductors in a step P5 and a location of contacts in step P6 are performed. In a step P3, whether or not the location object is the transistor object is checked, and if the location object is the transistor object, the processing goes into the step P4 in which the transistor is generated in accordance with given parameters, and a location position of the generated transistor is determined on the basis of the relational equation. On the other hand, if the location object is the wiring conductors, the processing goes into the step P5 in which a starting point and a terminating point of the wiring conductor are calculated in accordance with the relational equation, and the wiring is performed by using the designated wiring conductor layer. Furthermore, if the location object is the contact, the processing goes into the step P6 in which the location position is calculated in accordance with the relational equation, and a designated contact cell is located. This processing is performed for all the contents describing the relational equations.

Now, a specific example of this processing will be described with reference to FIG. 3A showing a layout diagram of cells to be located and wired and FIG. 3B illustrating the same by the relational equation of the transistor objects. Transistors Q1 and Q2 shown in FIG. 3A are expressed by transistor objects QO1 and QO2 shown in FIG. 3B, respectively. Wiring conductors W1, W2, W3, W4 and W5 shown in FIG. 3A are expressed by wiring conductors WO1, WO2, WO3, WO4 and WO5 shown in FIG. 3B, respectively, which indicate a center line of the path. Contacts TH1 and TH2 shown in FIG. 3A are expressed by contacts THO1 and THO2 shown in FIG. 3B, respectively.

For example, in the case of locating the wiring conductor WO2, it is necessary to determine end points P21 and P22. If the transistor object QO1 is located, an X-coordinates of the end point P21 is positioned at a position for separating the wiring conductor WO1 from the transistor object QO1 by a spacing interval of the design rule, and a Y-coordinates of the end point P22 is positioned at a position for separating the wiring conductor WO2 from the transistor object QO1 by the spacing of the design rule. A Y-coordinates of the end point P21 is the same as a Y-coordinates of the end point P22, and an X-coordinates of the end point P22 is the same as an X-coordinates of the terminal T26 of the transistor object QO2.

Therefore, the X-coordinates and the Y-coordinates of the end point P22 are obtained after processing the wiring conductor WO4, the contact TH2 and the transistor object QO2 and deciding the terminal T26 of the transistor object QO2. Finally, the end points P21 and P22 are interconnected by a designated wiring conductor layer and a designated wiring conductor width.

In this first prior art placement and routing method, in the case of determining the wiring conductor WO2, it is necessary to consider the position of the terminal of the transistor object QO2 which is not directly connected to the wiring conductor WO2. In other words, as regards a wiring conductor which is not directly connected to the terminal of the transistor object, it is necessary to investigate influence of all the terminal positions, and to determine the wiring order and the location order of the transistor objects, if necessary, in order to introduce them into the relational equation. This makes the relational equation complicated, and becomes easy to overlook the wiring conductor subjected to influence, when the number of transistors is large.

Furthermore, in order to realize the first prior art placement and routing method, it is a general practice to describe a cell generation program for each cell, and therefore, it is not possible to hold data per each cell, and therefore, it is difficult to modify a cell constituting element.

Now, the second prior art placement and routing method will be explained with reference to a flow chart of FIG. 4. First, in a step R1, parameters of the transistor sizes are set as the transistor object, and then, a relative position between the transistor objects is designated. Then, in a step R2, transistors is generated in accordance with the parameters of the transistor described in the relative position information. Thereafter, in a step R3, a location position (origin) of a first transistor object is determined, and in a step R4, the generated transistors are located in accordance with the relative position described in the relative position information. At this time, adjustment is conducted to avoid the transistors from being overlapped to one another. Then, in a step R5, a wiring is conducted to connect between the located transistors by use of diffused layers, polysilicon wiring layers, and aluminum wiring layers, in accordance with the connection information.

This wiring is conducted by first communizing the transistors by using the diffused layers, and then, by making the connection by use of the polysilicon wiring layers and the aluminum wiring layers. At this time, when it becomes necessary to connect the wiring layers of different levels, a necessary contact is located to satisfy the design rule. Alternatively, if a space required for the wiring conductor does not exist between the transistors, a processing is conducted to expand the spacing between the transistors.

Now, a specific example of this processing will be described with reference to FIG. 5A showing a layout diagram of cells to be located and wired and FIG. 5B illustrating a relative position of the cells by the relational equation of the transistor objects. Transistors Q3, Q4 and Q5 shown in FIG. 5A are expressed by transistor objects QO3, QO4 and QO5 shown in FIG. 5B, respectively, which show a relative position of these transistors.

First, transistors are generated in accordance with the sizes L and W of the respective transistor objects QO3, QO4 and QO5, and the generated transistors are located in such a manner that the transistors never overlap with one another. Then, in accordance with the connection information, the diffused layers of the transistor objects QO3, QO4 and QO5 are communized to a possible extent, and further, connections between terminals of the transistors are performed by use of the polysilicon wiring layers and the aluminum wiring layers. At this time, when the wiring layers to be connected to each other are at different levels, a connection contact is located.

If a wiring space is insufficient at the stage of generating wiring conductors W15 and W14 and contacts TH3 and TH4, a spacing between the transistor object QO5 and the transistor objects QO3 and QO4 is expanded to a necessary degree. Ultimately, a layout as shown in FIG. 5A is obtained.

In this second prior art location and routine method, however, for example when the channel length L of the transistor Q5 is enlarged, there is possibility that the wiring conductors W14 and W13 are generated to take a roundabout or circuitous route avoiding the transistors Q3 and Q4, as a wiring pattern indicated by wiring conductors W14A and W13A, W13B and W13C and contacts TH23 and TH24 shown in FIG. 5C, with the result that there is generated the necessity of interconnecting the wiring conductors of different levels. This is considered to be generated in the course of calculating the cost of the wiring route in an automatic wiring processing. If the circuitous route wiring conductor is generated, the circuit area becomes large, and an extra wiring capacitance is added. Furthermore, in order to realize the second prior art location and routing method, a large scaled automatic wiring tool and a so called compaction program become necessary.

As mentioned above, the first prior art location and routing method is disadvantageous in that it is necessary to investigate influence of terminal positions of transistor objects for all wiring conductors including wiring conductors which are not connected directly to the terminals of the transistor objects, and to determine the wiring order and the location order of the transistor objects, if necessary, in order to introduce them into the relational equation. Therefore, when the number of transistors is large, the relational equation becomes complicated, and it becomes easy to overlook the wiring conductor subjected to influence.

Furthermore, it is necessary to describe a cell generation program for each cell, and therefore, it is not possible to hold inherent data per each cell. As a result, it is difficult to modify a cell constituting element, for example to change the size of some transistors.

On the other hand, the second prior art location and routing method is disadvantageous in that, because of the automatic wiring, when the transistor size is changed, there is possibility of generation of a circuitous route wiring which increases the circuit area and the wiring capacitance.

Furthermore, in order to realize the second prior art location and routing method, a large scaled automatic wiring tool and a so called compaction program become necessary.

SUMMARY OF THE INVENTION

Accordingly, it is an object of the present invention to provide a placement and routing method for a semiconductor integrated circuit, which has overcome the above mentioned defects of the conventional ones.

Another object of the present invention is to provide a placement and routing method for a semiconductor integrated circuit, capable of reducing the number of layout design steps while holding the relative position of constituents.

The above and other objects of the present invention are achieved in accordance with the present invention by a placement and routing method for the semiconductor integrated circuit having circuit elements or function circuit blocks, including transistors, on a semiconductor chip, the placement and routing method being for automatically generating necessary parameterized cells by giving a design rule and a design information including the size of the transistors, the method including:

an object describing step for preparing an object description which describes each of the transistors as a transistor object and each wiring conductor as a wiring object, and which includes a relative position information of each object in relation to an adjacent object and a connection information indicative of a connection destination of each object:

a transistor object processing step for generating the transistors in accordance with the object description and locating the generated transistors by considering the relative position information;

a wiring object processing step for determining a position of the each wiring object in a horizontal direction and in a vertical direction by considering the relative position information;

an object end point determining step for determining a final position of each transistor object and a final staring point and a final terminating point of each wiring object; and a wiring post-processing step for wiring each wiring object by a designated wiring layer.

The above and other objects, features and advantages of the present invention will be apparent from the following description of preferred embodiments of the invention with reference to the accompanying drawings.

DESCRIPTION OF THE PREFERRED EMBODIMENTS

Figure 6:
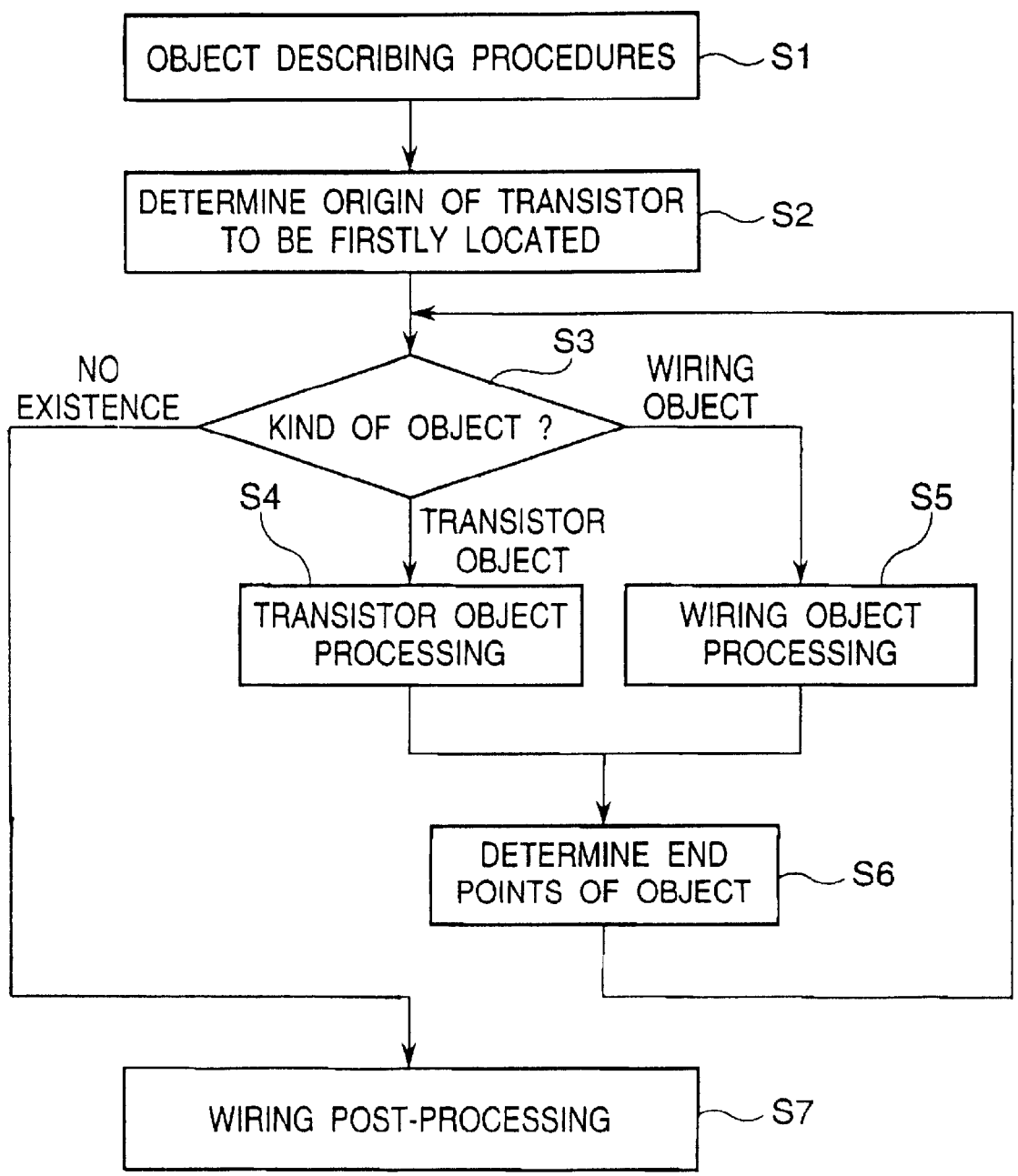
FIG. 6 is a flow chart illustrating a first embodiment of the placement and routing method in accordance with the present invention.

Referring to FIG. 6, there is shown a flow chart illustrating a first embodiment of the placement and routing method in accordance with the present invention.

According to the first embodiment of the placement and routing method in accordance with the present invention, structures of all basic cells to be generated are described by transistor objects and wiring objects in an object describing step S1. In each transistor object, parameters of a transistor size, a connection information indicating a connection destination of the transistor object concerned, and upper and lower or right and left objects adjacent to the transistor object concerned, are designated.

Figure 7A:
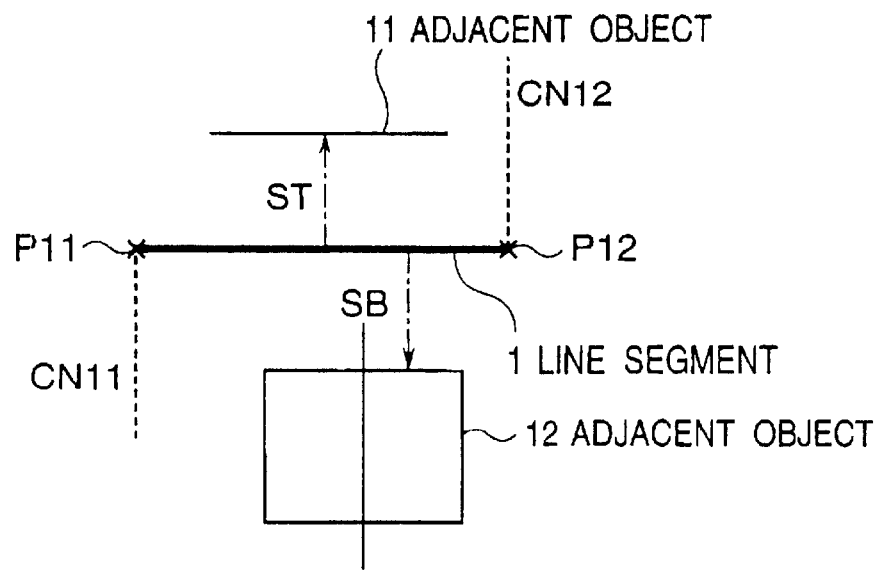
FIGS. 7A and 7B illustrate the conception of the wiring objects in the placement and routing method in accordance with the present invention.
Figure 7B:
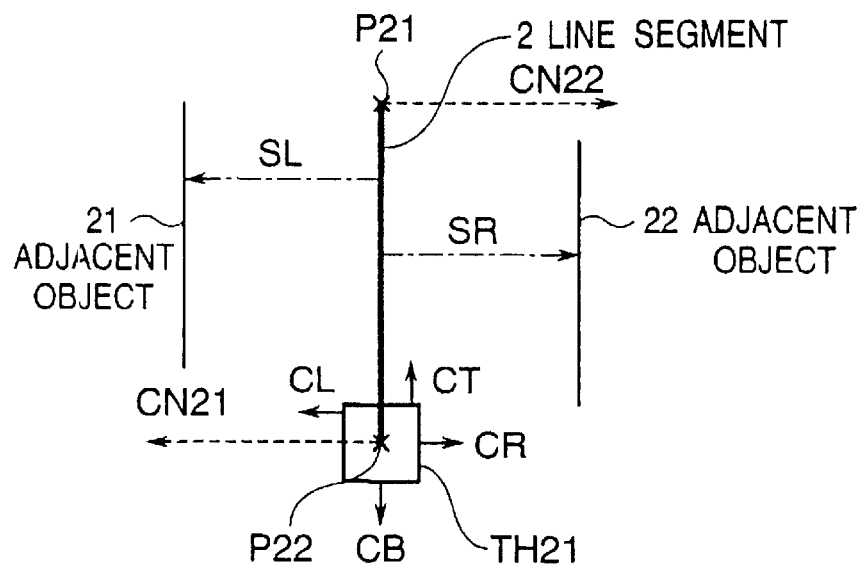

Next, the conception of the wiring objects will be described with reference to FIGS. 7A and 7B, which diagrammatically illustrate the wiring objects. The wiring objects include a horizontal wiring object indicating a horizontal wiring conductor as shown in FIG. 7A, and a vertical wiring object indicating a vertical wiring conductor as shown in FIG. 7B. Each of the wiring objects is composed of a line segment having two opposite end points and has information concerning a wiring layer, connection information of the two end points, and upper and lower or right and left adjacency conditions ST and SB or SL and SR. These end points are determined in an object end point determining step S6.

The horizontal wiring object as shown in FIG. 7A designates a wiring layer, the line segment 1 having two opposite end points P11 and P12 on the wiring layer, adjacent objects 11 and 12 adjacent to the horizontal wiring object in directions indicated by an upper direction adjacency condition ST and a lower direction adjacency condition SB, respectively, and respective connection information CN11 and CN12 of the end points P11 and P12.

On the other hand, the vertical wiring object as shown in FIG. 7B designates a wiring layer, the line segment 2 having two opposite end points P21 and P22 on the wiring layer, adjacent objects 21 and 22 adjacent to the vertical wiring object in directions indicated by a left direction adjacency condition SL and a right direction adjacency condition SR, respectively, and respective connection information CN21 and CN22 of the end points P21 and P22.

In each of the horizontal and vertical wiring objects, when an adjacent object is not designated, it is considered that the wiring conductor coordinates is extended to a connection destination.

If the wiring layer of the wiring object is different from the wiring layer of the connection destination, an object is designated which needs to consider an adjacency relation when a through-hole type contact for connecting between the different wiring layers is located. For example, FIG. 7B shows a contact TH21 for connecting between the different wiring layers, as well as the upper, lower, left and right adjacency conditions CT, CB, CL and CR of the contact TH21.

Figure 1:
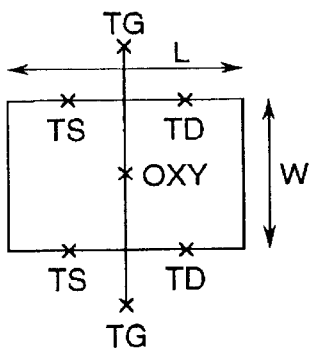
FIG. 1 diagrammatically illustrates the conception of the transistor object.
Figure 2:
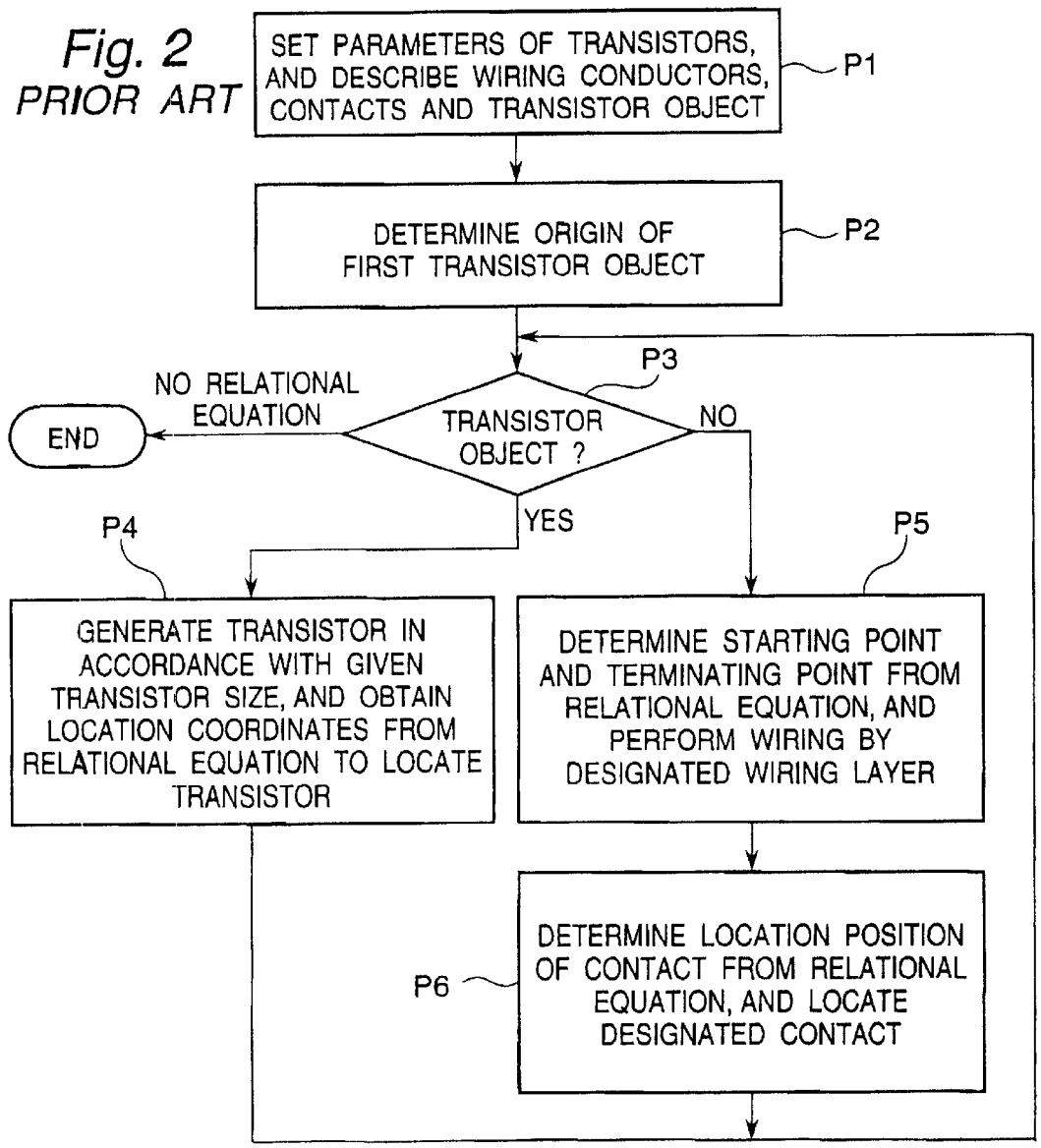
FIG. 2 is a flow chart illustrating one example of the first prior art placement and routing method.
Figure 3A:
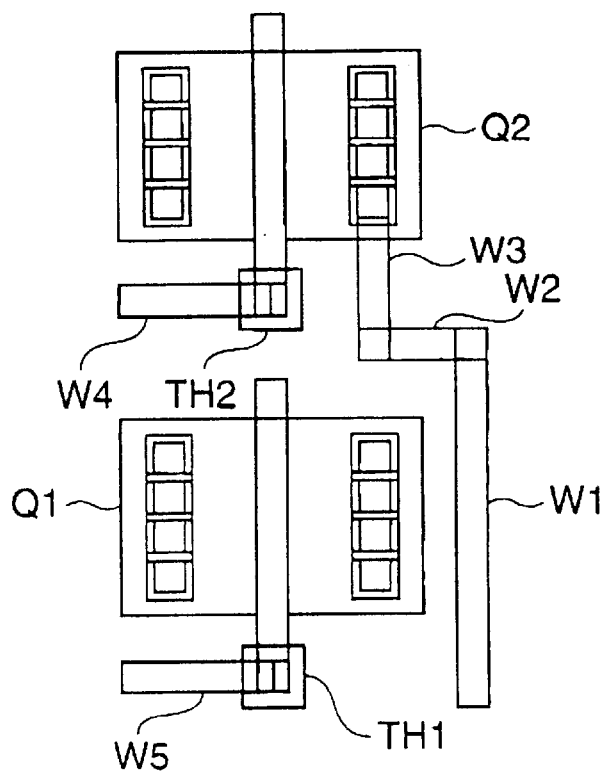
FIG. 3A shows a layout diagram of cells to be located and wired.
Figure 3B:
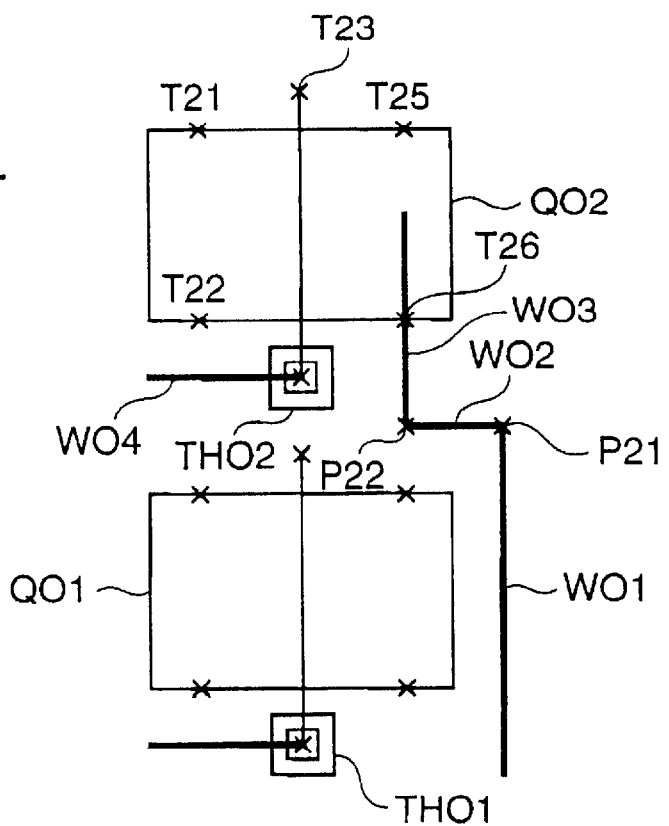
FIG. 3B illustrates the relational equation of the transistor objects in accordance with the first prior art placement and routing method.
Figure 4:
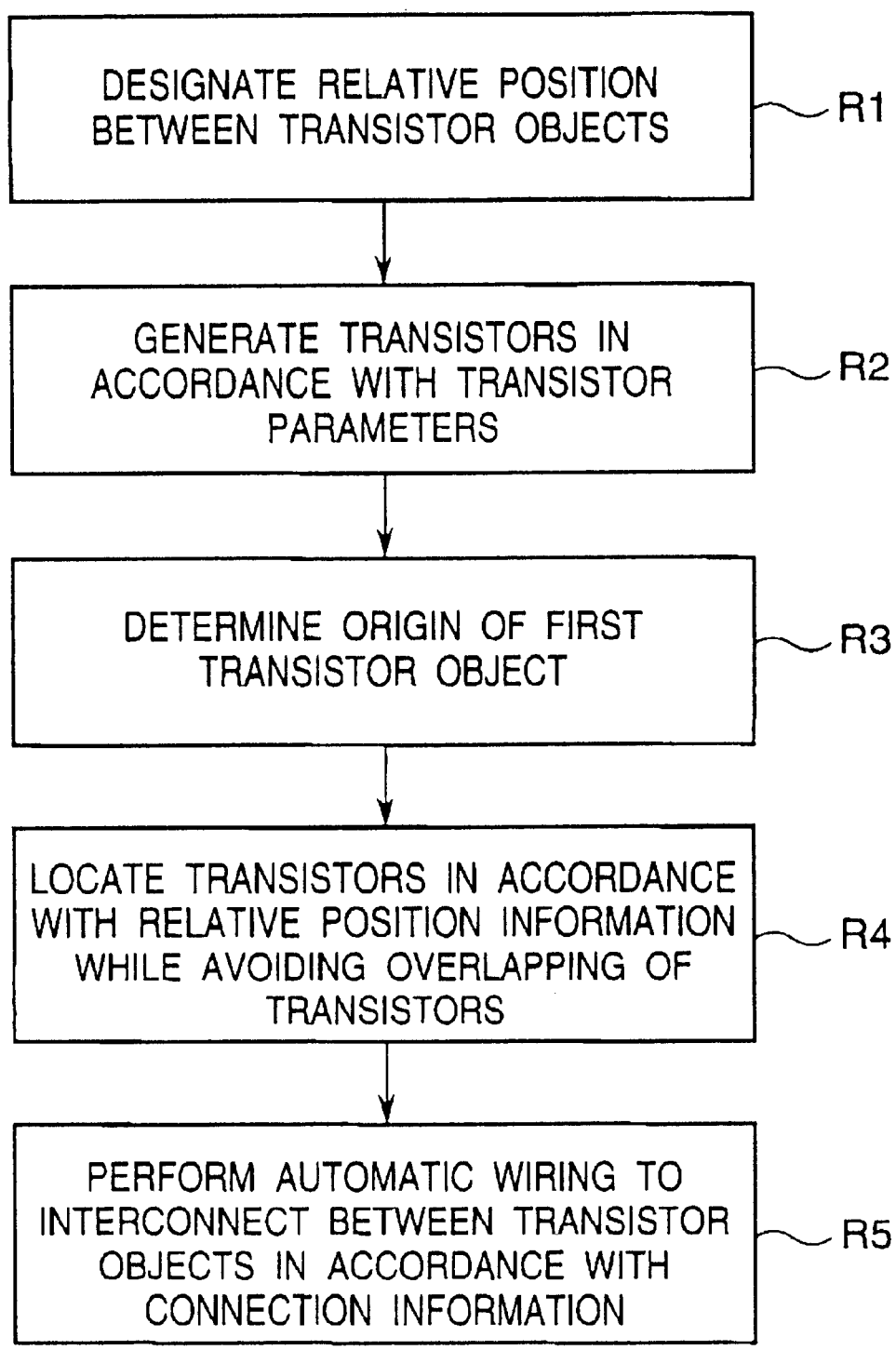
FIG. 4 is a flow chart illustrating one example of the second prior art placement and routing method.
Figure 8:
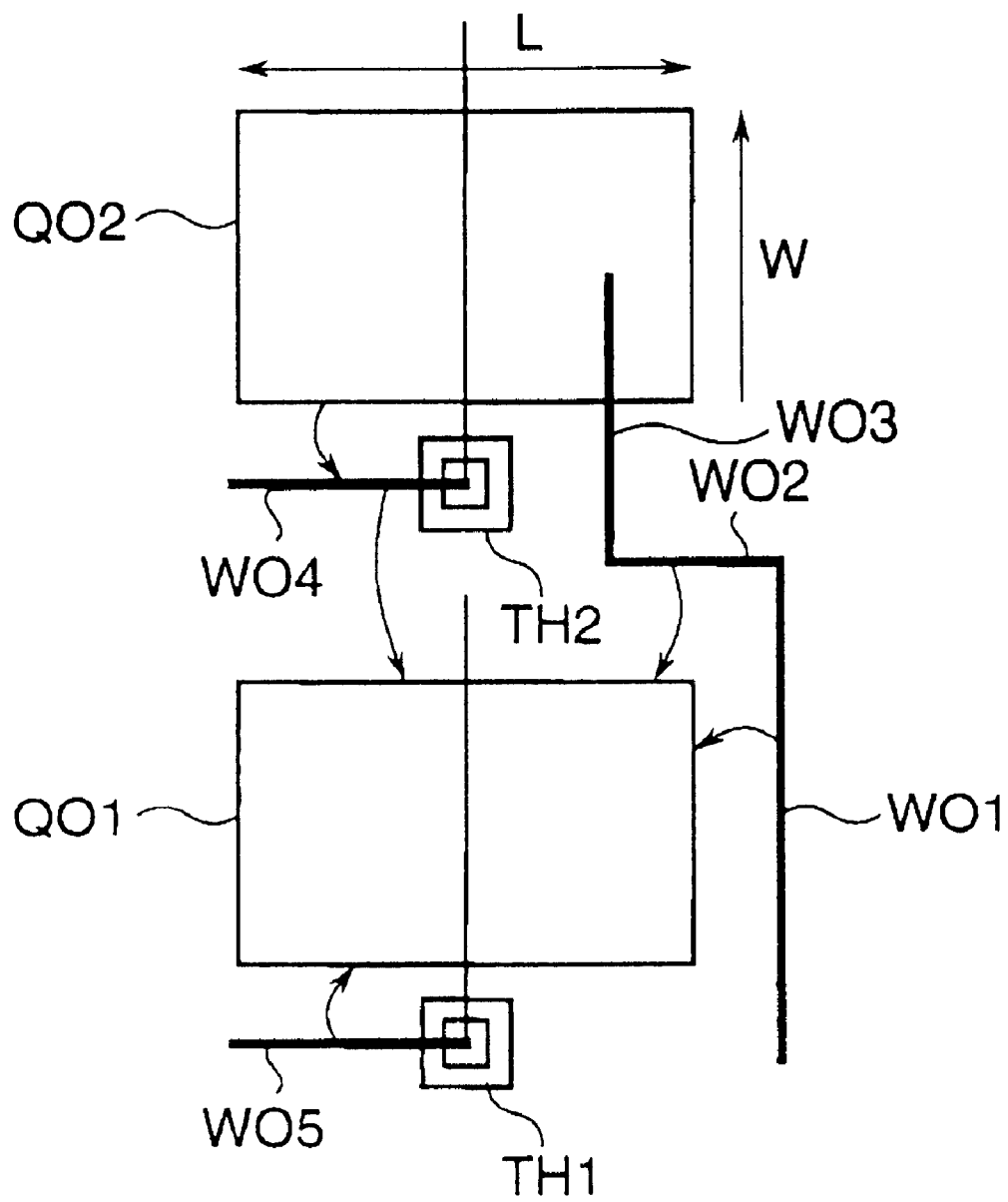
FIG. 8 illustrates a relation between the wiring objects in the placement and routing method in accordance with the present invention.

Now, a specific object relationship will be explained with reference to FIG. 8, which illustrates the layout structure shown in FIG. 3A, in the form of an object relationship diagram. In FIG. 8, elements similar or corresponding to those shown in FIG. 3B are given the same Reference Signs and Numerals, and the adjacency relation is indicated by arrowheaded curved lines.

The shown layout includes the transistor objects QO1 and QO2, the horizontal wiring objects WO2, WO4 and WO5 and the vertical wiring objects WO1 and WO3.

The transistor object QO2 is adjacent to the horizontal wiring object WO4 in a lower direction, and is connected to the horizontal wiring object WO4 and the vertical wiring object WO3. In addition, the transistor sizes L and W of the transistor object QO2 are set.

The horizontal wiring object WO2 is adjacent to the transistor object QO1 in a lower direction, and is connected to the vertical wiring objects WO1 and WO3. In addition, it is designated that the wiring layer of the horizontal wiring object WO2 is a first level aluminum layer.

Returning to FIG. 6, in a step 2, an origin of a transistor to be firstly located is determined, and in a step 3, the kind of the object is discriminated in the order of the object numbers as shown in FIG. 8. As a result of the discrimination, the processing goes into either a transistor object processing step S4 or a wiring object, processing step S5, or otherwise, into a wiring post-processing step S7 when no object exists.

In the transistor object processing step S4, a transistor is generated in accordance with the designated transistor size, and if no adjacency condition is designated, the generated transistor is located at the origin. If the adjacency condition is designated, a Y-coordinates is determined at a position separated from an upper or lower designated object by a necessary spacing designated by the design rule (design rule spacing), and an X-coordinates is determined at a position separated from a left or right designated object by the design rule spacing, and thereafter, the generated transistor is located at a position designated by the Y-coordinates and the X-coordinates thus determined. However, if it is designated to communize the diffused layer of the transistor concerned, the transistor is located adjacent to an already located transistor having a diffused layer which is designated to be communized with the diffused layer of the transistor concerned.

In the wiring object processing step S5, in accordance with the connection information, a Y-coordinates of the horizontal wiring object is determined as being the Y-coordinates of a terminal position of an already located object, if no upper/lower adjacency condition is designated. If an upper/lower adjacency condition is designated, the Y-coordinates of the horizontal wiring object is determined at a position separated from the upper/lower adjacent object by the design rule spacing, by performing a processing similar to the adjacency condition processing of the transistor object.

In the case of the vertical wiring object, when no left/right adjacency condition is designated, an X-coordinates of the vertical wiring object is determined in accordance with the connection information, similarly to the case of the horizontal wiring object. If a left/right adjacency condition is designated, an X-coordinates of the vertical wiring object is determined at a position separated from the left/right adjacent object by the design rule spacing.

At each time the object processing is completed, terminal positions of the object are determined in an object end point determining step S6. The terminal positions of the transistor object can be calculated from the transistor location position, since distances from the origin of the transistor to the terminal position of three terminals of the transistor is previously known. When the wiring object to be connected to the transistor object is already located, in the case of the horizontal wiring object, the X-coordinates of the connection terminal of the horizontal wiring object is changed to the X-coordinates of the connection terminal of the transistor object. In the case of the vertical wiring object, the Y-coordinates of the connection terminal of the vertical wiring object is changed to the Y-coordinates of the connection terminal of the transistor object.

In addition, since the Y-coordinates position of the connection terminal of the horizontal wiring object is already determined in the wiring object processing step S5, when the object to be connected is already located, the X-coordinates of the connection terminal of the horizontal wiring object is changed to the X-coordinates of the connection terminal of the already located object. Similarly, since the X-coordinates position of the connection terminal of the vertical wiring object is already determined, when the object to be connected is already located, the Y-coordinates of the connection terminal of the vertical wiring object is changed to the Y-coordinates of the connection terminal of the already located object.

Furthermore, the position of the connection terminal of the wiring object to be connected to another wiring object is processed similarly to the processing for the wiring object to be connected to the transistor object.

When the level of the terminal layer of each object is different from the level of the terminal layer of a connection destination, an optimum contact is selected from contacts described in the design rule, and the selected contact is located by considering the adjacency condition of the contact location.

In the wiring post-processing step S7 after all the object processings are completed, a final layout is generated by conducting the wiring by designated wiring layers in accordance with the determined wiring positions.

Next, a specific example of the transistor object processing step S4, the wiring object processing step S5, the object end-point processing step S6 and the wiring post-processing step S7, will be described with reference to FIGS. 9A to 9E, which illustrate the object processing flow, step by step, when the placement and routing method in accordance with the present invention is applied to the cell indicated by the object diagram of FIG. 8.

Figure 9A:
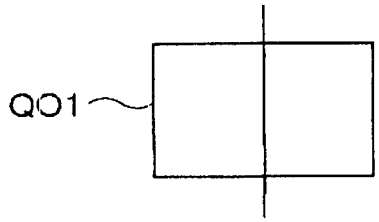
FIGS. 9A to 9E illustrate the object processing flow, step by step, in the placement and routing method in accordance with the present invention.
Figure 9B:
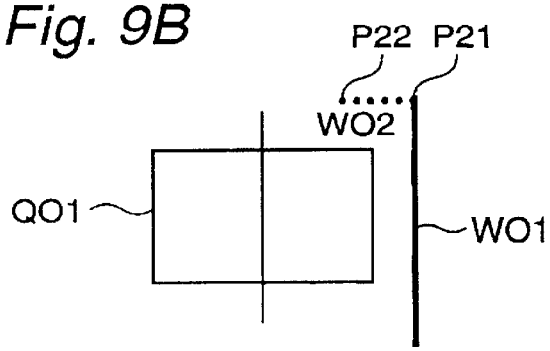

First, as shown in FIG. 9A, the transistor object QO1 is generated in accordance with the transistor size, and is located at the origin determined in the step S2. FIG. 9B illustrates a condition after the horizontal wiring object WO2 has been processed. Since the horizontal wiring object WO2 is adjacent to the transistor object QO1 in a lower direction, the Y-coordinates of the horizontal wiring object WO2 is determined at a position separated from the transistor object QO1 by the design rule spacing. The horizontal wiring object WO2 is connected to the vertical wiring objects WO1 and WO3. Here, since the vertical wiring object WO1 has been already located, the X-coordinates of the vertical wiring object WO1 has been already determined, and therefore, the end point P21 of the horizontal wiring object WO2 is finally determined. However, the end point P22 of the horizontal wiring object WO2 is not determined since the vertical wiring object WO3 has not yet been located.

Figure 9C:
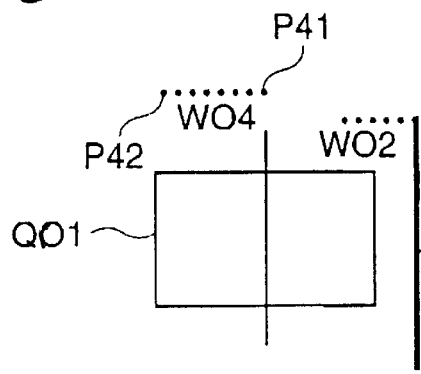

Similarly, when the horizontal wiring object WO4 is processed, since the transistor object QO2 has not yet been located, an end point P41 of the horizontal wiring object WO4 is not determined. This condition is shown in FIG. 9C.

Figure 9D:
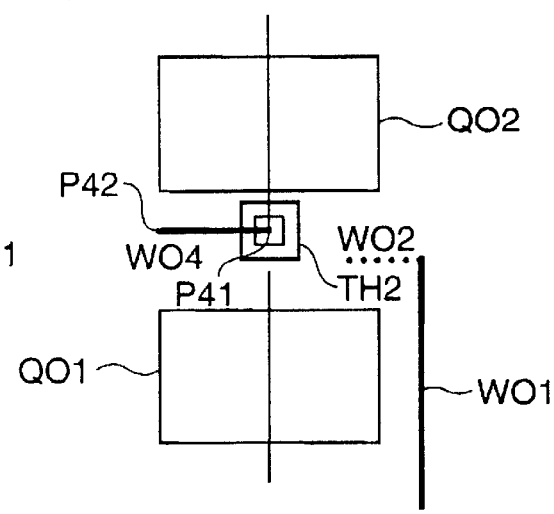

FIG. 9D illustrates a condition after the transistor object QO2 has been located. Since the transistor object QO2 is adjacent to the wiring object WO4 in a lower direction, the Y-coordinates of the transistor object QO2 is determined to be separated from the wiring object WO4 by the necessary design rule spacing. On the other hand, since no left/right adjacency condition is designated for the transistor object QO2, the X-coordinates of the origin is selected as the X-coordinates of the transistor object QO2. When the transistor object QO2 has been located, the X-coordinates of the end point P41 is determined. In addition, since the level of the wiring object WO4 is different from the level of the connection terminal of the transistor object QO2, the contact TH2 is located.

Figure 9E:
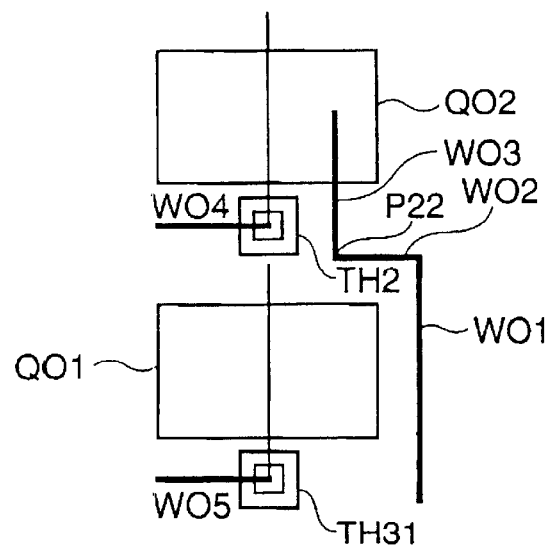

FIG. 9E illustrates a condition after the vertical wiring object WO3 and the horizontal wiring object WO5 have been processed. Since the vertical wiring object WO3 has no adjacency condition designated, the terminal position of the transistor object QO2 is determined as an X-coordinates of the vertical wiring object WO3. In addition, since the vertical wiring object WO3 is connected to the horizontal wiring object WO2, the end point P22 of the vertical wiring object WO2 is finally determined at this stage.

Figure 9F:
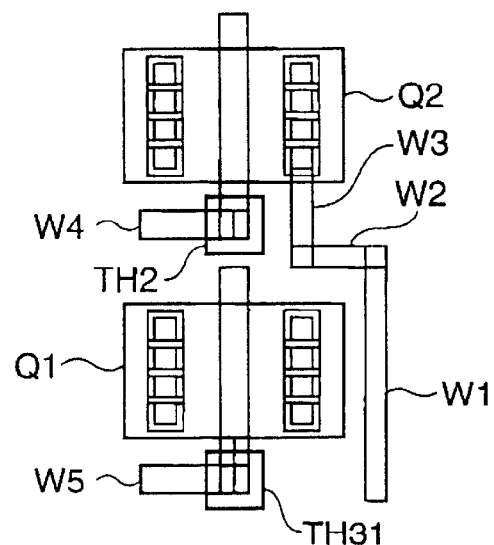

FIG. 9F illustrates a layout diagram obtained by replacing the transistor objects QO1 and QO2 with the transistors Q1 and Q2, respectively and also by adding the designated wiring layer and the wiring conductor width of the design rule to the wiring objects WO1, WO2, WO3, WO4 and WO5, so as to obtain the wiring conductors W1, W2, W3, W4 and W5.

Figure 5A:
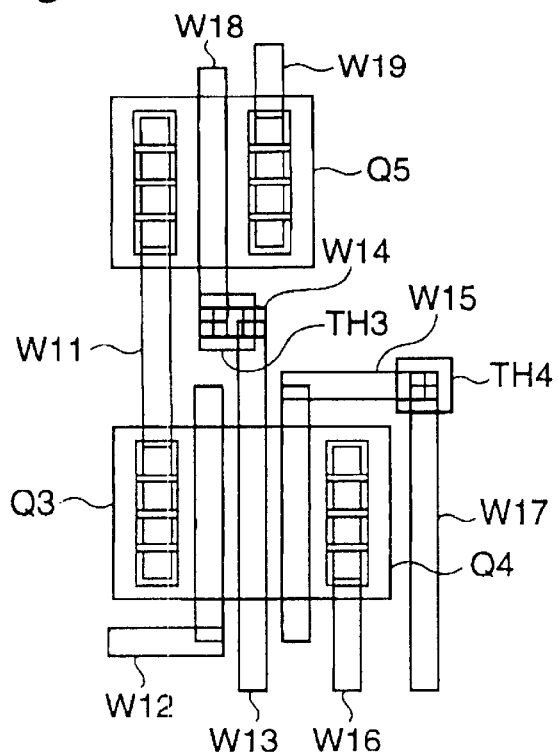
FIG. 5A shows a layout diagram of cells to be located and wired
Figure 5B:
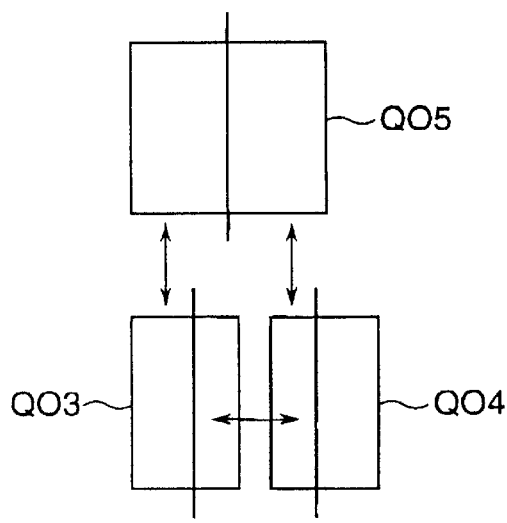
FIG. 5B illustrates the relational equation of the transistor objects in accordance with the second prior art placement and routing method.
Figure 5C:
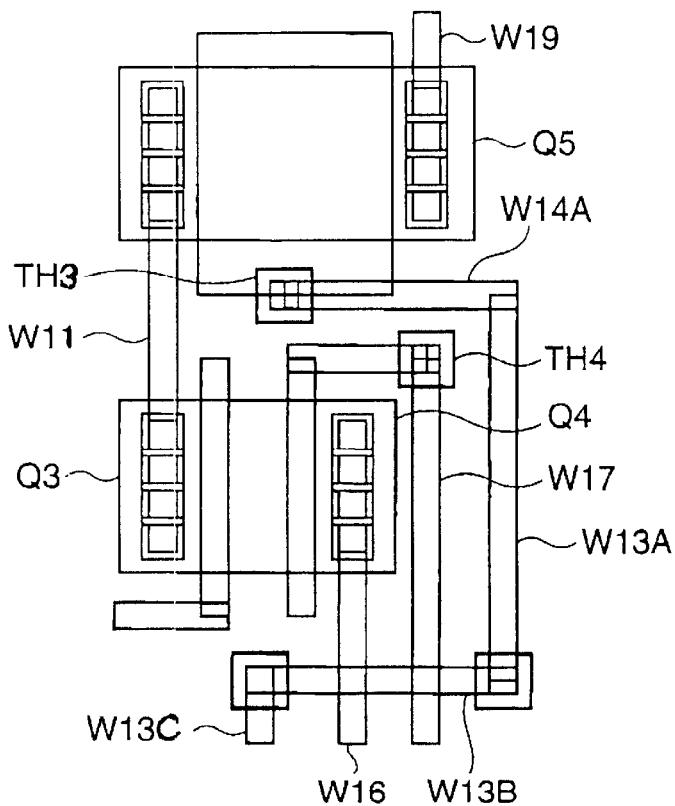
FIG. 5C is a layout diagram showing the result of execution of the second prior art placement and routing method.
Figure 10A:
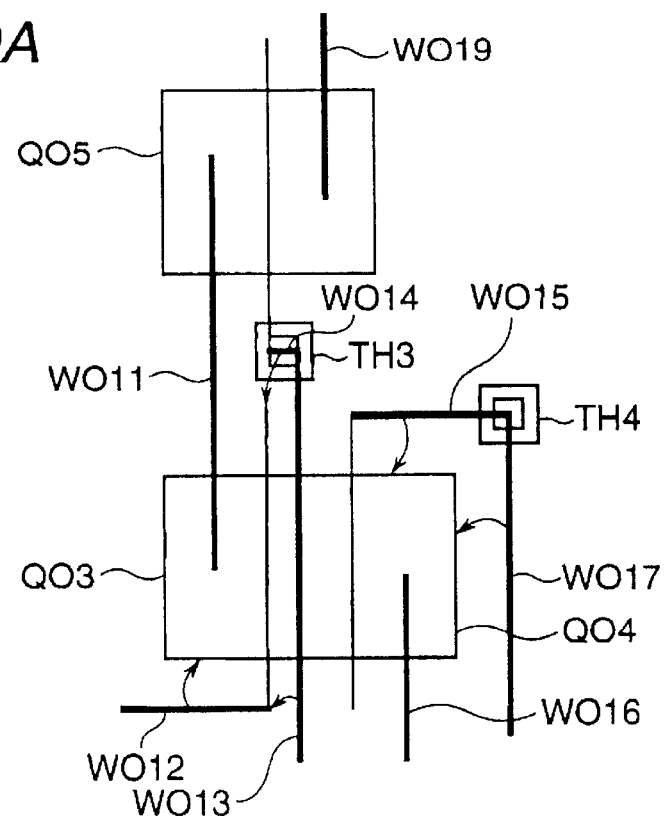
FIGS. 10A and 10B show the conception of the wiring objects, for illustrating an operation of a second embodiment of the placement and routing method in accordance with the present invention.

Now, a second embodiment of the placement and routing method in accordance with the present invention will be described with reference to FIG. 10A, in which elements corresponding to those shown in FIG. 5A are given the Reference Signs and Numerals obtained by inserting "O" into the same Reference Signs and Numerals. FIG. 10A shows the layout diagram of FIG. 5A, by means of transistor objects QO3, QO4 and QO5 and wiring objects WO11, WO12, WO13, WO14, WO15, WO16, WO17 and WO19, and also adds the adjacency relation by arrowheaded curved lines. The wiring object WO14 is adjacent to the transistor object QO3 in a lower direction, and the wiring object WO13 is adjacent to the wiring object WO12 in a left direction.

Figure 10B:
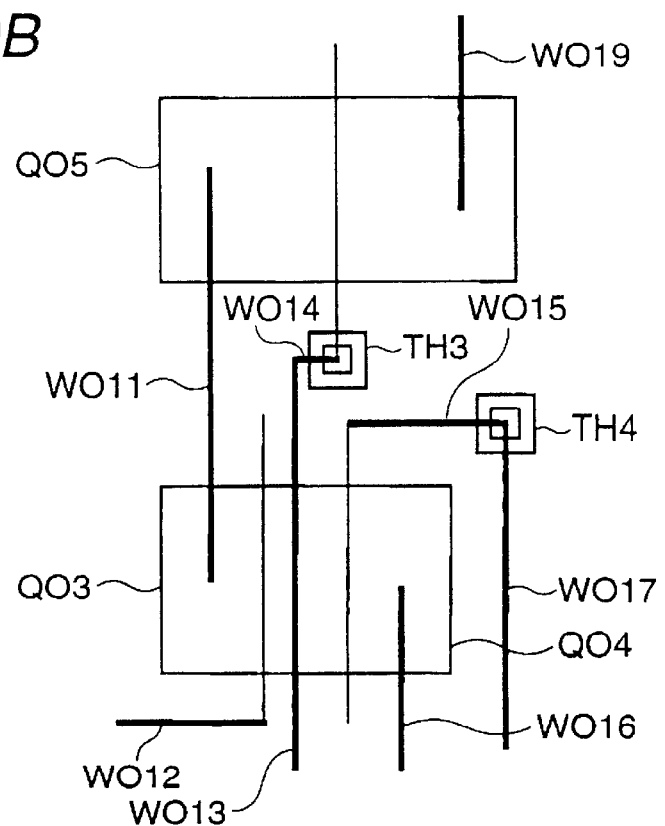

FIG. 10B shows the layout diagram obtained when the transistor size L (length) of the transistor object QO5 is enlarged. Since the adjacency relation is designated for the wiring objects WO14 and WO13, even if the position of the wiring object WO14 is shifted in a horizontal direction (left-right direction), the wiring object WO13 is located at a right side of the wiring object WO12, so that the relative position relationship is maintained always.

As seen from the above, the placement and routing method in accordance with the present invention for the semiconductor integrated circuit is characterized by comprising an object describing step for preparing an object description which describes each transistor as a transistor object and each wiring conductor as a wiring object and which includes a relative position information of each object to an adjacent object and a connection information of each object, a transistor object processing step for generating each transistor in accordance with the object description and locating the generated transistor in accordance with the relative position information, a wiring object processing step for determining a position of each wiring in a horizontal direction and in a vertical direction, and an object end point determining step for determining a final position of each transistor object and a final staring point and a final terminating point of each wiring object. Therefore, even in the case of locating a wiring conductor which is not connected directly to a transistor, since the position of the transistor is considered, the amount of description can be reduced to about one half to one fifth of the prior art example. On the other hand, unless the wiring conductor is not connected directly to a transistor, it is not necessary to consider the terminal position of the transistor. In addition, since the objects are described simply in order, it is possible to reduce possibility of overlooking, and to shorten the number of designing steps.

Furthermore, comparing with the automatic wiring, the representation of the wiring objects makes it possible to generate a layout pattern as expected, and therefore, neither an extra wiring capacitance nor an extra wiring resistance is added, with the result that a layout giving an excellent characteristics can be generated, Moreover, comparing with the automatic wiring, the representation of the wiring objects can reduce the size of the program. Since information of each basic cell can be held as data, it is possible to easily change the cell constituents.

The invention has thus been shown and described with reference to the specific embodiments. However, it should be noted that the present invention is in no way limited to the details of the illustrated structures but changes and modifications may be made within the scope of the appended claims.

What is claimed is:

1. A placement and routing method for the semiconductor integrated circuit having circuit elements or function circuit blocks, having transistors, on a semiconductor chip, the placement and routing method being for automatically generating necessary parameterized cells by giving a design rule and a design information including the size of said transistors, the method including:

an object describing step for preparing an object description which describes in a predetermined graphic form each of said transistors as a transistor object in the form a cell and each wiring conductor as a separate horizontal wiring object and a separate vertical wiring object and which includes a relative position information of each object in relation to an adjacent object and a connection information indicative of a connection destination of each object;

a transistor object processing step for generating said transistors in accordance with the object description and locating the generated transistors by considering said relative position information;

a horizontal and vertical wiring object processing step for determining a position of each wiring objects for positioning both horizontal and vertical conductors in one level of a plurality of levels in both a horizontal direction and in a vertical direction by considering said relative position information;

an object end point determining step for determining a final position of each transistor object and a final staring point and a final terminating point of each of said horizontal and vertical wiring object; and a wiring post-processing step for wiring each wiring object by a designated wiring layer.

2. A placement and routing method claimed in claim 1 wherein both transistor objects and wiring objects are addressed interchangeably and further comprising the step, after such object describing step, of a discriminating step for discrimination which of the transistor object and the wiring object is the described object.

3. A placement and routing method claimed in claim 2, wherein said wiring object has a horizontal or vertical wiring direction information, an adjacent object information, a connection destination information and a contact information.

4. A placement and routing method claimed in claim 2, wherein said wiring object is composed of a line segment having two opposite end points and has information concerning a wiring layer, connection information of the two end points, and upper and lower or right and left adjacency conditions.

5. A placement and routing method claimed in claim 1, wherein said wiring object has a horizontal or vertical wiring direction information, an adjacent object information, a connection destination information and a contact information.

6. A placement and routing method claimed in claim 1, wherein said wiring object is composed of a line segment having two opposite end points and has information concerning a wiring layer, connection information of the two end points, and upper and lower or right and left adjacency conditions.

7. A placement and routing method for a semiconductor integrated circuit which includes sets of circuit elements including transistors or sets of function circuit blocks on a semiconductor chip, the method for automatically generating a parameterized cell which is a required basic cell, by inputting a design information including a design rule and the size of said transistors, the method includes:

an object describing step for preparing an object description by describing all the structure of said parameterized cell to be generated, by use of transistor objects corresponding to said transistors and wiring objects corresponding to vertical and horizontal wiring conductors, said object description containing a relative position information including an adjacency condition between said transistor object or said wiring object and an adjacent object adjacent to said transistor object or said wiring object in a vertical or horizontal direction, and a connection information indicative of a connection destination of each of said transistor object and said wiring object a transistor origin setting step for determining, in accordance with said object description, the origin of a location position where a transistor to be first located is located;

a transistor object processing step for generating said transistors in order in accordance with said object description in such a manner that when said adjacency condition is not designated, said transistor is located on said origin and when said adjacency condition is designated, said transistor is located by considering said relative position information;

a wiring object processing step for determining a position of each of said wiring objects in the vertical and horizontal directions in such a manner that when said adjacency condition is not designated, the coordinates of said wiring object is determined, in accordance with said connection information, to be the same as the coordinates of a terminal position of an already located object, and when said adjacency condition is designated, the coordinates of said wiring object is determined by considering said relative position information;

an object end point determining step for determining a starting point and a terminating point of a final wiring conductor for each of said transistor objects and said wiring objects; and a wiring post-processing step for constituting said wiring conductor by a designated wiring layer.

8. A placement and routing method claimed in claim 7, further including, after said object describing step, a discriminating step for discriminating which of said transistor object and said wiring object, an object described in said object description is.

9. A placement and routing method claimed in claim 7, wherein said wiring object includes a horizontal wiring object indicating a horizontal wiring conductor and a vertical wiring object indicating a vertical wiring conductor, each of said horizontal wiring object and said vertical wiring object being constituted of a line segment having two opposite ends and including a wiring layer, an adjacency condition in a vertical or horizontal direction, and a connection information corresponding to said two opposite ends.

\* \* \* \* \*